United States Patent
Yuen et al.

[19]
[11] Patent Number: 5,943,265
[45] Date of Patent: Aug. 24, 1999

[54] METHOD AND APPARATUS FOR SWITCHING NODES BETWEEN MULTIPLE POTENTIALS

[75] Inventors: Guy S. Yuen; Chinh D. Nguyen, both of San Jose, Calif.

[73] Assignee: Programmable Microelectronics Corp., San Jose, Calif.

[21] Appl. No.: 09/133,481

[22] Filed: Aug. 12, 1998

[51] Int. Cl.$^6$ .................................................. G11C 16/06
[52] U.S. Cl. ............................... 365/185.23; 365/189.05; 365/189.11; 365/230.06
[58] Field of Search ...................... 365/185.23, 230.06, 365/189.09, 189.05, 189.11

[56] References Cited

U.S. PATENT DOCUMENTS

| | | | |
|---|---|---|---|
| 5,027,320 | 6/1991 | Pathak et al. ............................ | 365/185 |
| 5,604,711 | 2/1997 | Cheung ............................... | 365/230.06 |
| 5,615,164 | 3/1997 | Kirihata et al. .................... | 365/230.06 |

*Primary Examiner*—David Nelms
*Assistant Examiner*—Tuan T. Nguyen
*Attorney, Agent, or Firm*—William L. Paradice, III

[57] ABSTRACT

A switching circuit includes a first switch connected between a first node and a first potential, a second switch connected between the first node and a second potential levels, a third switch connected between the first node and an output terminal, and a fourth switch connected between the output terminal and a third potential. A first control signal controls the conductivity of the first and second switches, a second control signal controls the conductivity of the third switch, and a logical combination the first and second control signals controls the conductivity of the fourth switch.

11 Claims, 4 Drawing Sheets

METHOD AND APPARATUS FOR SWITCHING NODES BETWEEN MULTIPLE POTENTIALS

BACKGROUND

1. Field of Invention

This invention relates generally to PMOS semiconductor memories and specifically to switching a word line of a PMOS non-volatile memory array between multiple potential levels.

2. Description of Related Art

Non-volatile memories such as, for instance, EEPROM and Flash EEPROM, include a plurality of memory cells contained within an array. Typically, the memory cells are floating gate MOS transistors having a source, a drain, a floating gate, and a control gate. Since such floating gate memory cells are programmed by inducing the accumulation of electrons on the floating gate and erased by discharging electrons from the floating gate, the threshold voltage ($V_T$) of a programmed cell is more positive than that of an erased cell. It is the difference between the program $V_T$ and the erase $V_T$ of a cell which determines the "binary state"of the cell. For instance, a programmed cell represents the binary value "1", and an erased cell represents the binary value binary "0". To read the binary state of a cell, a read voltage which lies between the program $V_T$ and the erase $V_T$ is applied to the control gate of the cell. Thus, if the cell is an NMOS device, the cell conducts a channel current if in an erased state and, conversely, if the cell is a PMOS device, the cell conducts a channel current if in a programmed state.

FIG. 1 shows a PMOS floating gate memory cell 10 in accordance with that disclosed in U.S. Pat. No. 5,687,118, issued to Chang on Nov. 11, 1997. Cell 10 includes a channel region 20 extending between p+ source 16 and p+ drain 18 regions formed in an n– well 12 of a p– substrate 14. A floating gate 22 is insulated from the surface of n– well 12 by a thin tunnel oxide layer 24. A control gate 26 overlies floating gate 22. During programming and erasing operations of an array of cells 10, such as that disclosed in the co-pending U.S. patent application Ser. No. 08/911,968 entitled "Non-volatile Memory Array Architecture" and Ser. No. 08/947,850 entitled "Non-volatile PMOS Two-Transistor Memory Cell and Array", it is necessary to switch the word lines of the array (not shown) of cells 10 between multiple potential levels.

For instance, during programming operations, selected word lines are typically driven to a high positive potential such as, for instance, 9 volts, while un-selected word lines are held at lower voltages such as, for instance, 3 volts. During erasing operations, selected word lines are driven to a negative voltage such as –9 volts, while un-selected word lines are held at a floating potential. Thus, thus is a need for a circuit that is capable of switching the word lines of an associated memory array between a high positive potential, a high negative potential, an intermediate potential, and a floating potential.

SUMMARY

A switching circuit is disclosed which allows a node such as, for instance, a word line of an associated memory array, to be switched between multiple potential levels. In accordance with the present invention, the switching circuit includes a first switch connected between a first node and a first potential, a second switch connected between the first node and a second potential, a third switch connected between the first node and an output terminal, and a fourth switch connected between the output terminal and a third potential. A first control signal controls the conductivity of the first and second switch, a second control signal controls the conductivity of the third switch, and a logical combination the first and second control signals controls the conductivity of the fourth switch.

Like components in the Figures are similarly labeled.

DETAILED DESCRIPTION

Figure 1:
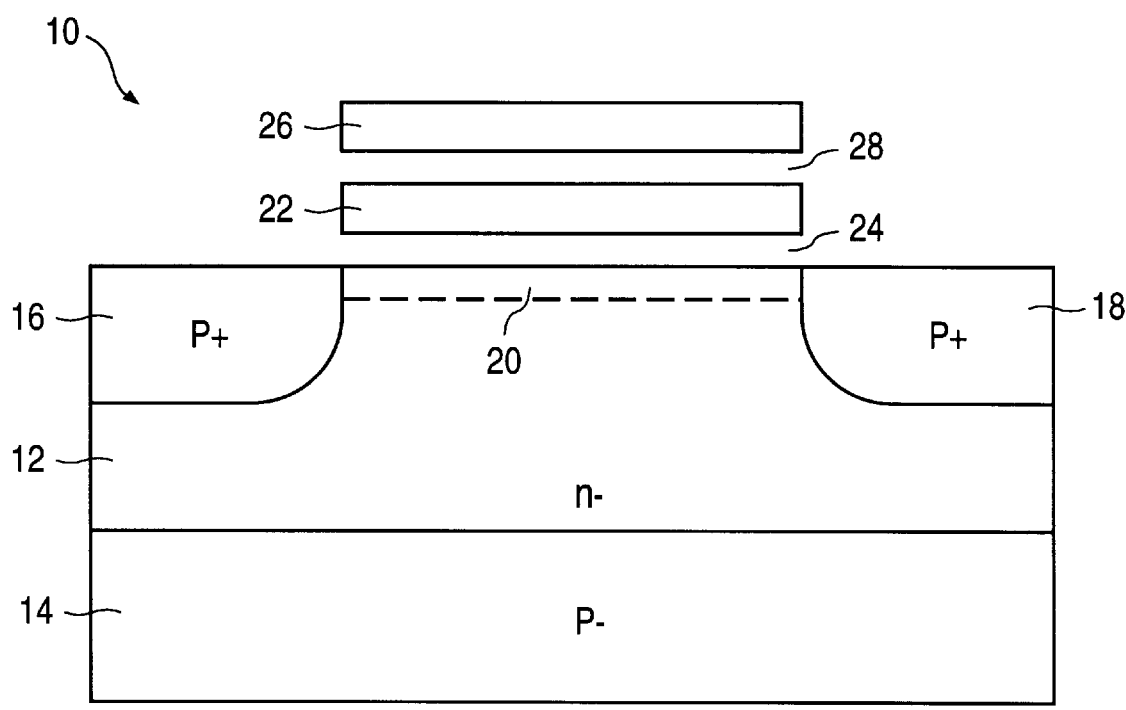
FIG. 1 is a cross-sectional view of a PMOS floating gate memory cell.

Principles of the present invention are described below with reference to a memory array of the memory cell 10 of FIG. 1 for simplicity only. It is to be understood that embodiments of the present invention may be employed to switch virtually any node between multiple positive and negative potentials. Accordingly, the present invention is not to be construed as limited to specific examples provided herein.

Figure 2:
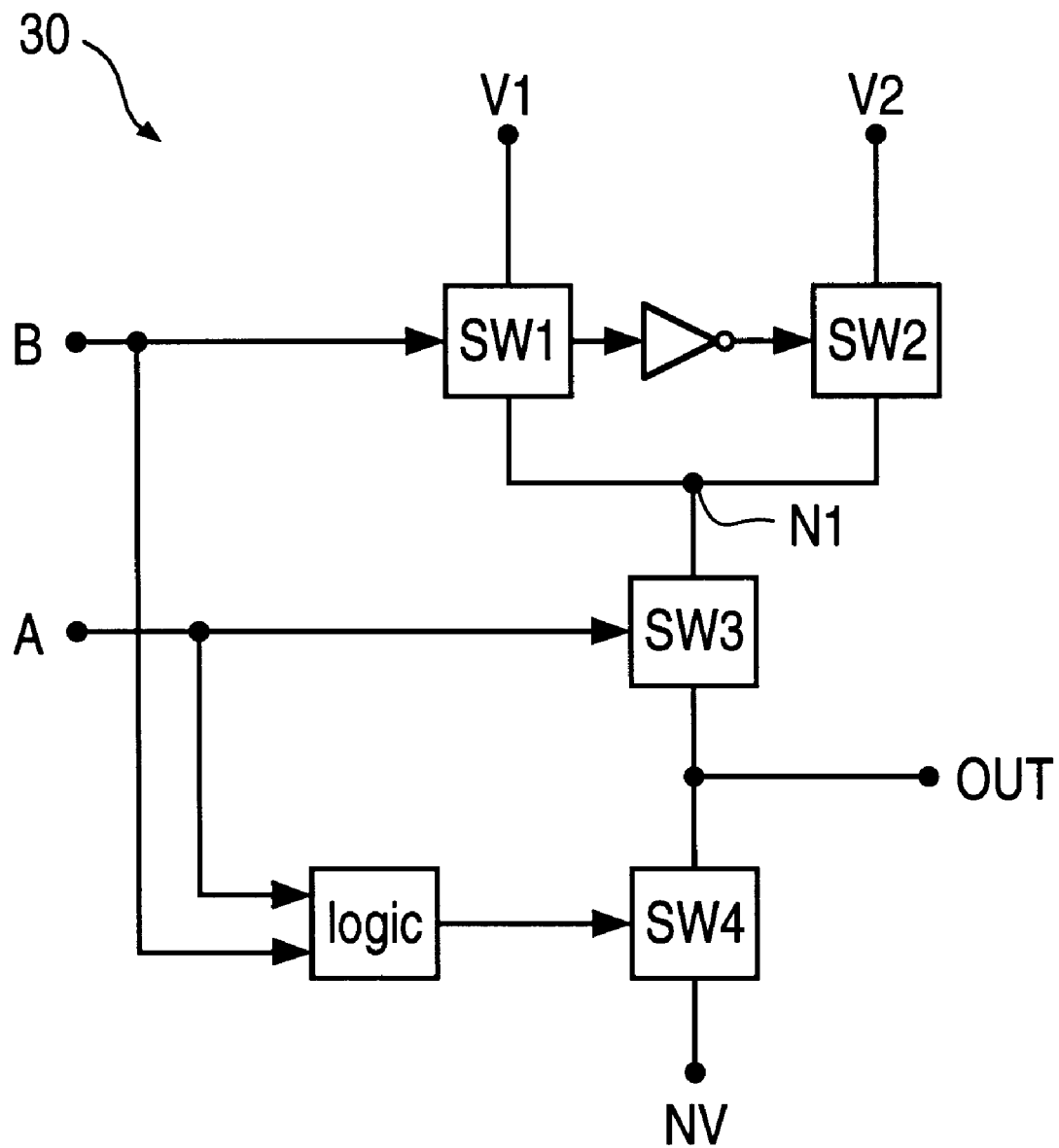
FIG. 2 is a block diagram of a switching circuit in accordance with the present invention.

Referring to FIG. 2, a switching circuit 30 includes a first switch SW1 connected between a first node N1 and a first potential V1, a second switch SW2 connected between the first node N1 and a second potential V2, a third switch SW3 connected between the first node N1 and an output terminal OUT of the switching circuit 30, and a fourth switch SW4 connected between the output terminal OUT and a negative potential NV. A first control signal A controls the conductivity of the third switch SW3. A second control signal B controls the conductivity of the first SW1 and second SW2 switch. The first and second control signals A and B are combined in a logic circuit to generate a signal which controls the conductivity of the fourth switch SW4. In some embodiments, the first potential V1 is a high positive potential such as, for instance, about 9 volts, and the second potential V2 is a nominal positive voltage such as, for instance, about 3 volts, and the negative voltage NV is about –9 volts.

To drive the output terminal OUT to either the first V1 or second V2 potentials, signal A is in a first logic state so as to turn on the third switch SW3 and couple the output terminal OUT to node N1. When the signal B is in a first logic state, the first switch SW1 turns on and the second switch SW2 turns off, thereby coupling the output terminal to the first potential V1. Conversely, when the signal B is in a second logic state, the first switch SW1 turns off and the second switch SW2 turns on, thereby coupling the output terminal OUT to the second potential V2. Here, the first logic state of signal A forces, via the logic circuit, the switch SW4 to a non-conductive state so as to isolate the output terminal OUT from the negative potential NV.

When the signal A is in a second logic state, the switch SW3 is non-conductive and isolates the output terminal OUT from node N1. If the signal B is in the first logic state, the switch SW4 is forced, via the signal generated by the logic circuit, to a conductive state so as to couple the output terminal OUT to the negative potential NV. If, on the other hand, the signal B is in the second logic state, the switch SW4 is forced to a non-conductive state and thereby isolates the output terminal OUT from the negative potential NV. As a result, the output terminal OUT is at a floating potential.

Figure 3:
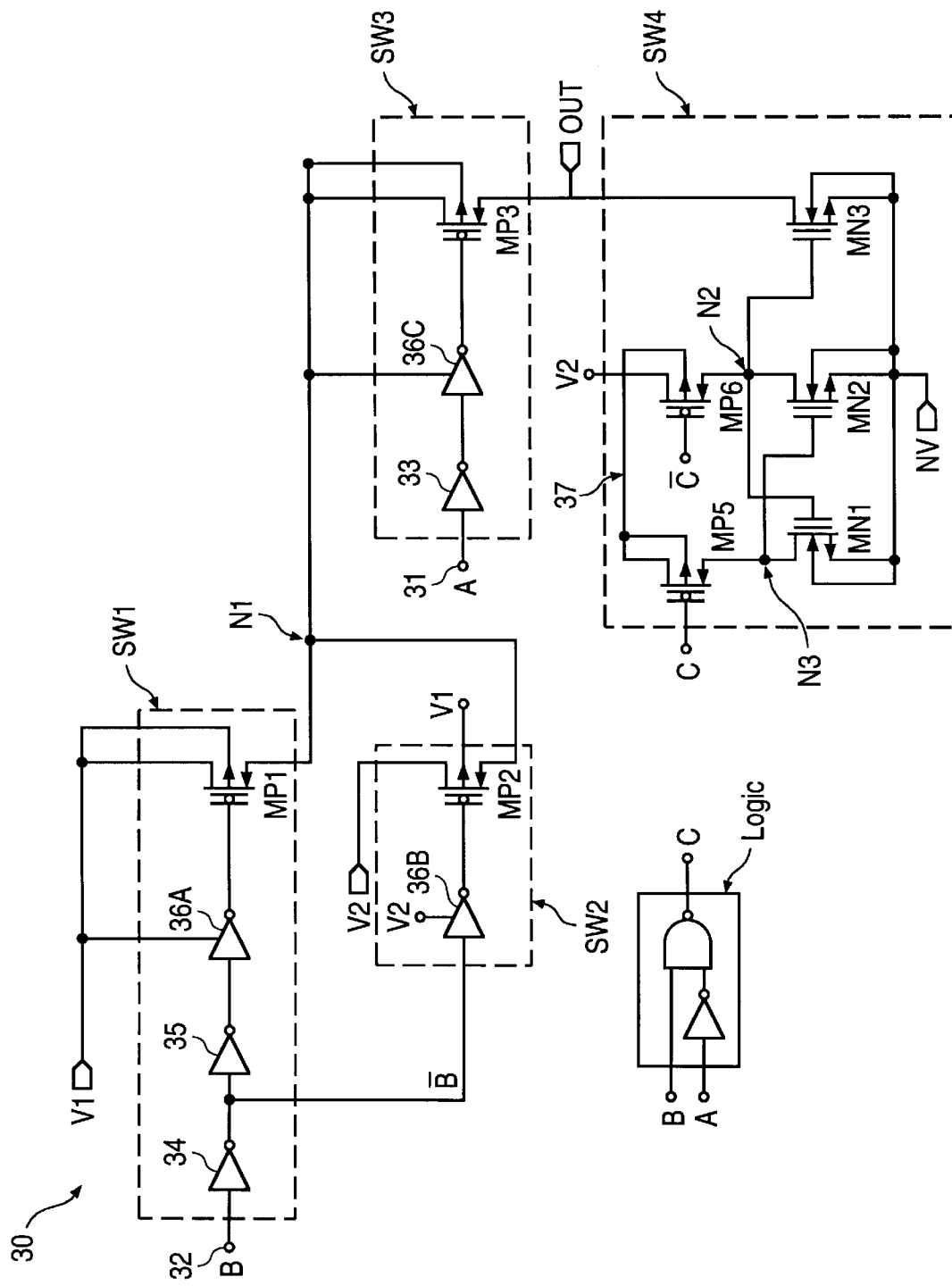
FIG. 3 is a schematic diagram of a preferred embodiment of the switching circuit of FIG. 2.

FIG. 3 shows a switching circuit 30 in accordance with a preferred embodiment. Here, the switching circuit 30 includes first 31 and second 32 input terminals for receiving the first A and second B control signals, respectively. Signals A and B are passed through respective inverters 33 and 34, which are preferably standard CMOS inverters, to ensure proper CMOS logic levels. Signal B is provided as an input to a buffer circuit 36A via an inverter 35. The buffer circuit 36A switches the gate of a first PMOS pull-up transistor MP1 between the high positive voltage V1 and ground potential in response to the logic level of signal B. The complement of signal B, i.e., signal $\overline{B}$, is provided as an input signal to a buffer circuit 36B which, in response to the logic level of signal $\overline{B}$, switches the gate of a second PMOS pass transistor MP2 between the nominal voltage V2 and ground potential. The – well region(s) within which are formed pull-up transistors MP1 and MP2 is coupled to the high positive voltage V1. In some embodiments, the high positive voltage V1 is generated using a suitable charge pump such as, for instance, that disclosed in U.S. Pat. No. 5,625,544, issued to Kowshik on Apr. 29, 1997.

A third PMOS pull-up transistor MP3 is connected between the respective drains of pass transistors MP1 and MP2 and the output terminal OUT of the switching circuit 30. In preferred embodiments, the output terminal OUT is connected to a word line of an associated memory array (not shown). The gate of transistor MP3 is switched between the voltage at node N1 and ground potential by a buffer circuit 36C in response to the logic level of signal of the first control signal A. An NMOS pull-down transistor MN3 is connected between the output terminal OUT and a high negative potential NV and has gate coupled to the output terminal of a cross-coupled latch 37 at node N2, as shown in FIG. 3.

The cross-coupled latch 37 includes a PMOS transistor MP5 and an NMOS transistor MN1 connected between the nominal voltage V2 and the high negative voltage NV. The gate of transistor MP5 is coupled to receive an input signal C, and the gate of transistor MN1 is coupled to the output terminal of the latch 37, i.e., node N2. The latch 37 includes a second PMOS transistor MP6 coupled between the nominal potential V2 and node N2, and an NMOS transistor MN2 coupled between node N2 and the high negative voltage NV. The gate of transistor MN2 is coupled to the common drain of transistors MP5 and MN1, and the gate of transistor MP6 is coupled to receive the logical complement of signal C, i.e., signal $\overline{C}$. Signal C is generated in a well known manner by combining signals $\overline{A}$ and B in a NAND gate, as shown in FIG. 3, and signal $\overline{C}$ is generated by complementing signal C using, for instance, a standard CMOS inverter.

As mentioned above, the potential at the output terminal OUT of the switching circuit 30 is determined by the logic levels of the control signals A and B. When it is desired to drive the output terminal OUT to the nominal voltage V2, such as, for instance, during reading operations of an associated PMOS memory array, the control signals A and B are both set to 0, i.e., to logic low. Here, in response to a logic low signal at its input terminal, the buffer circuit 36A drives the gate of the pull-up transistor MP1 to the high positive voltage V1. The pull-up transistor MP1 turns off and thereby isolates node N1 from the high positive voltage V1. In response to the logic high signal at its input terminal, the buffer circuit 36B pulls the gate of the pull-up transistor MP2 to ground potential. Transistor MP2 turns on pulls node N1 to the nominal potential V2. The logic low signal A is inverted and provided to the buffer circuit 36C as a logic high signal. In response thereto, the buffer circuit 36C pulls the gate of the pull-up transistor MP3 to ground potential. Transistor MP3 turns on and pulls the output terminal OUT to the nominal potential V2 via node N1.

Since signals A and B are both low, signal C is low and its complement signal $\overline{C}$ is high. In response thereto, transistor MP5 turns on and pulls node N3 to the nominal potential V2, while transistor MP6 turns off and isolates node N2 from the nominal potential V2. Since node N3 is at the potential V2, which is preferably more positive than the threshold voltage $V_T$ of transistor MN2, transistor MN2 turns on and pulls the gate of transistor MN3 to the high negative voltage NV, thereby ensuring that transistor MN3 remains in a non-conductive state so as to isolate the output terminal OUT from the high negative voltage NV. Here, transistor MN1 is off and thereby isolates node N3 from the high negative voltage NV.

When it is desired to drive the output terminal OUT to the high positive voltage V1, such as, for instance, to drive selected word lines of an PMOS associated memory array during programming operations, signals A and B are low and high, respectively. Here, a logic high signal is provided to the input terminal of the buffer circuit 36A which, in response thereto, pulls the gate of the pull-up transistor MP1 to ground potential. As a result, transistor MP1 turns on and pulls node N1 to the high positive voltage V1. A logic low signal is provided to the input terminal of the buffer circuit 36B and, in response thereto, the buffer circuit 36B pulls the gate of the pull-up transistor MP2 to the nominal potential V2. Consequently, transistor MP2 is maintained in an off state and thereby isolates node N1 from the nominal potential V2. Since signals A and B are low and high, respectively, signal C is low and complement signal $\overline{C}$ is high. As discussed above, the logic low state of signal A a turns on pull-up transistor MP3, thereby pulling the output terminal OUT to the high positive voltage V1, while the above-noted logic states of signals C and $\overline{C}$ maintain the pull-down transistor MN3 in a non-conductive state, thereby isolating the output terminal OUT from the high negative voltage NV.

When it is desired to drive the output terminal OUT to a high negative voltage, such as, for instance, to drive selected word lines of an associated PMOS memory array to a negative voltage during erasing operations, signals A and B are high and low, respectively. Here, signal C is high and its complement signal $\overline{C}$ is low. As mentioned above, the low logic state of signal B maintains pull-up transistor MP1 in a non-conductive state and turns transistor MP2 on. Thus, node N1 is pulled to the nominal potential V2. The logic high state of signal A is inverted and thereafter provided to the buffer circuit 36C which, in response thereto, couples the gate of the pull-up transistor MP3 to node N1. Since both the source and gate of transistor MP3 are at the nominal potential V2, transistor MP3 is maintained in a non-conductive state and thereby isolates the output terminal from node N1.

The logic high level of signal C turns off transistor MP5, thereby isolating node N3 from the nominal potential V2, while the logic low level of signal $\overline{C}$ turns on transistor MP6, thereby pulling node N2 to the nominal potential V2. Transistor MN1 turns on and pulls the gate of transistor MN2 to the high negative voltage NV, thereby turning off transistor MN2 and isolating node N2 from the high negative voltage NV. The positive potential V2 at node N2 turns on pull-down transistor MN3 which, in turn, pulls the output terminal OUT to the high negative voltage NV.

When it is desired to maintain the output terminal at a floating potential, such as, for instance, when the output terminal OUT is connected to un-selected word lines of an associated PMOS memory array during erasing operations, signals A and B are both high. Consequently, signal C is low and its complement signal $\overline{C}$ is high. As mentioned above, the logic high level of signal B maintains the pull-up transistor MP1 in a non-conductive state and turns transistor MP2 on, thereby pulling node N1 to the nominal potential V2. The logic high level of signal A maintains transistor MP3 in a non-conductive state and thereby isolates the output terminal OUT from node N1. The low and high states of signals C and $\overline{C}$, respectively, maintain the pull-down transistor MN3 in a non-conductive state and thereby isolate the output terminal OUT from the negative voltage NV. As a result, the output terminal OUT is at a floating potential.

Figure 4:
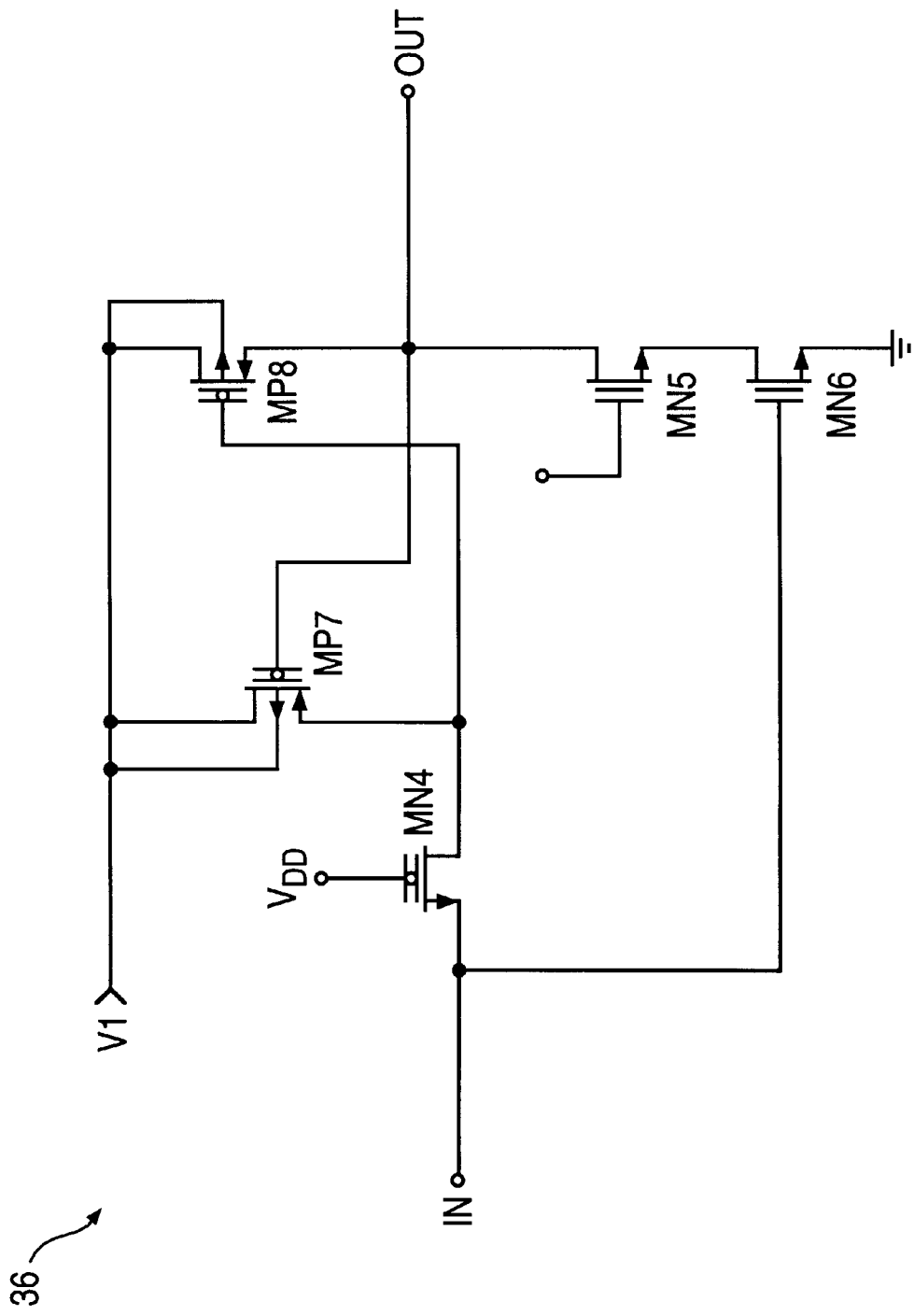
FIG. 4 is a schematic diagram of a buffer circuit in accordance with the switching circuit of FIG. 3.

A preferred embodiment of the buffer circuits 36A–36C is shown in FIG. 4. An NMOS pass transistor MN4 having a gate tied to a supply voltage $V_{DD}$ is connected between the input terminal IN of the buffer circuit 36 and the gate of a PMOS pull-up transistor MP8 which, in turn, is connected between the high positive voltage V1 and the output terminal OUT of the buffer circuit 36. A PMOS bias transistor MP7 is connected between the high positive voltage V1 and the gate of transistor MP8 and has a gate connected to the output terminal OUT of the buffer circuit 36. NMOS transistors MN5 and MN6 are connected in series between the output terminal OUT and ground potential. The gate of transistor MN5 is tied to the supply voltage $V_{DD}$, and the gate of transistor MNG is connected to the input terminal IN. Note that since the gates of transistors MN4 and MN5 are tied to $V_{DD}$, transistors MN4 and MN5 are maintained in a conductive state.

As mentioned above, when the signal received at the input terminal IN is logic low, the buffer circuit 36 pulls its output terminal OUT to the high positive voltage V1. Here, the logic low signal received at the input terminal IN is passed to the gate of transistor MP8 via pass transistor MN4. As a result, transistor MP8 turns on and pulls the output terminal OUT to the high positive voltage V1. The positive voltage V1 at the output terminal OUT maintains transistor MP7 in a non-conductive state, thereby isolating the high positive voltage V1 from the logic signal coupled to the gate of transistor MP8. Further, the logic low signal at the input terminal IN maintains transistor MN6 in a non-conductive state, thereby isolating the output terminal OUT from ground potential. Transistor MN5 provides a substantially constant voltage drop between the output terminal OUT and the drain of transistor MN6. This voltage drop is equal to $V1=V_{DD}-V_{Tn}$, where $V_{Tn}$ is the threshold voltage of transistor MN5. Otherwise, the voltage drop across transistor MN6 would be equal to the high positive voltage V1 which, in turn, may damage transistor MN6.

When, on the other hand, the signal received at the input terminal IN is logic high, the buffer circuit 36 pulls its output terminal OUT to ground potential. This logic high signal turns on transistor MN6 on which, in turn, pulls the output terminal OUT to ground potential. This logic high signal also maintains transistor MP8 in a non-conductive state, thereby isolating the output terminal OUT from the high positive voltage V1. Since the output terminal OUT is at ground potential, transistor MP7 turns on and couples gate of transistor MP8 to the high positive voltage V1, thereby ensuring that transistor MP8 remains in a non-conductive state.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For instance, present embodiments may be adapted for use with positive charge pumps fabricated using triple well technology.

We claim:

1. A circuit for switching a word line of an associated memory array between multiple potentials, said circuit comprising:
    a first switch connected between a first positive voltage supply and a first node and having a control terminal coupled to receive a first control signal;
    a second switch connected between a second positive voltage supply and said first node and having a control terminal coupled to receive a complement of said first control signal;
    a third switch connected between said first node and an output terminal and having a control terminal coupled to receive a second control signal;
    a fourth switch connected between said output terminal and a negative voltage supply and having a control terminal coupled to receive a signal representing a logical combination of said first and second control signals;
wherein said switching circuit selectively drives said output terminal to either said first positive voltage supply, said second positive voltage supply, said negative voltage supply, or a floating potential in response to said first and second control signals.

2. The circuit of claim 1, wherein said first switch comprises a first pull-up transistor connected between said first positive voltage supply and said first node and having a gate coupled to receive said first control signal.

3. The circuit of claim 2, wherein said second switch comprises a second pull-up transistor coupled between said second positive voltage supply and said first node and having a gate coupled to receive said complement of said first control signal.

4. The circuit of claim 3, wherein said third switch comprises a third pull-up transistor coupled between said first node and said output terminal and having a gate coupled to receive said second control signal.

5. The circuit of claim 4, wherein said fourth switch comprises a pull-down transistor coupled between said output terminal and said negative voltage supply and having a gate coupled to receive said signal representing the logical combination of said first and second control signals.

6. The circuit of claim 5, wherein said fourth switch further comprises a cross-coupled latch having an input terminal responsive to the logical combination of said first and second control signals and an output terminal connected to said gate of said pull-down transistor.

7. The circuit of claim 2, wherein said first switch further comprises a buffer circuit having an input terminal coupled to receive said first control signal, an output terminal coupled to said gate of said first pull-up transistor, a first terminal coupled to said first positive voltage supply, and a second terminal coupled to ground potential, wherein said buffer circuit couples its output terminal to said first positive voltage supply when said first control signal is in a first logic state and to ground potential when said first control signal is in a second logic state.

8. The circuit of claim 7, further comprising first and second CMOS inverters coupled in series between said input terminal of said buffer circuit and an input terminal for receiving said first control signal.

9. The circuit of claim 3, wherein said second switch further comprises a buffer circuit having an input terminal coupled to receive said complement of said first control signal, an output terminal coupled to said gate of said second pull-up transistor, a first terminal coupled to said second positive voltage supply, and a second terminal coupled to ground potential, wherein said buffer circuit couples its output terminal to said second positive voltage supply when said first control signal is in a second logic state and to ground potential when said first control signal is in a first logic state.

10. The circuit of claim 4, wherein said third switch further comprises a buffer circuit having an input terminal coupled to receive said second control signal, an output terminal coupled to said gate of said third pull-up transistor, a first terminal coupled to said first node, and a second terminal coupled to ground potential, wherein said buffer circuit couples its output terminal to said first node, and when said second control signal is in a first logic state and to ground potential when said second control signal is in a second logic state.

11. The circuit of claim 7, wherein said buffer circuit comprises:

a fourth pull-up transistor connected between said first positive voltage supply and said output terminal of said buffer circuit;

a pass transistor connected between said input terminal and a gate of said fourth pull-up transistor and having a gate coupled to a supply voltage;

a fifth pull-up transistor connected between said first positive voltage supply and said gate of said fourth pull-up transistor and having a gate coupled to said output terminal of said buffer circuit; and a second pull-up transistor connected between said output terminal of said buffer circuit and ground potential.

* * * * *